United States Patent
Ueda et al.

(10) Patent No.: US 9,029,994 B2
(45) Date of Patent: May 12, 2015

(54) SEMICONDUCTOR DEVICE

(75) Inventors: Tetsuya Ueda, Tokyo (JP); Yoshihiro Yamaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/405,890

(22) Filed: Feb. 27, 2012

(65) Prior Publication Data

US 2012/0313252 A1    Dec. 13, 2012

(30) Foreign Application Priority Data

Jun. 9, 2011    (JP) ................................ 2011-129261

(51) Int. Cl.
| | |
|---|---|
| H01L 23/02 | (2006.01) |
| H01L 23/433 | (2006.01) |
| H01L 23/31 | (2006.01) |
| H01L 23/373 | (2006.01) |
| H01L 25/07 | (2006.01) |

(52) U.S. Cl.
CPC ........ *H01L 23/4334* (2013.01); *H01L 23/3121* (2013.01); *H01L 23/3735* (2013.01); *H01L 25/072* (2013.01); *H01L 2224/32225* (2013.01); *H01L 2224/48137* (2013.01); *H01L 2224/48227* (2013.01); *H01L 2224/73265* (2013.01); *H01L 2224/48091* (2013.01); *H01L 2224/45124* (2013.01); *H01L 2924/13055* (2013.01); *H01L 2924/1305* (2013.01)

(58) Field of Classification Search
CPC ..... H01L 23/34; H01L 23/492; H01L 23/585; H01L 23/051; H01L 24/26
See application file for complete search history.

(56) References Cited

U.S. PATENT DOCUMENTS

| | | | | |
|---|---|---|---|---|
| 5,559,373 A | * | 9/1996 | Applebaum | .................. 257/710 |
| 5,621,243 A | * | 4/1997 | Baba et al. | .................... 257/712 |
| 5,767,573 A | * | 6/1998 | Noda et al. | .................... 257/675 |
| 6,166,433 A | | 12/2000 | Takashima et al. | |

(Continued)

FOREIGN PATENT DOCUMENTS

| | | |
|---|---|---|
| CN | 101030570 A | 9/2007 |
| CN | 102005419 A | 4/2011 |

(Continued)

OTHER PUBLICATIONS

German Office Action issued Oct. 22, 2012 in patent Application No. 10 2012 206 596.2 with English Translation.

(Continued)

*Primary Examiner* — David Zarneke
(74) *Attorney, Agent, or Firm* — Oblon, McClelland, Maier & Neustadt, L.L.P.

(57) ABSTRACT

A semiconductor device includes a base plate having one main surface joined to an insulating substrate on which a semiconductor chip and the like are mounted and a transfer mold resin which is so provided as to cover the one main surface of the base plate, the insulating substrate, the semiconductor chip, and the like and expose the other main surface of the base plate. The coefficient of linear expansion of the base plate is lower than that of copper and the coefficient of linear expansion of the transfer mold resin is not higher than 16 ppm/° C. The transfer mold resin has such scooped shapes as to expose opposed short-side centers and the vicinity of the base plate, respectively. The base plate has mounting holes in portions exposed by the scooped shapes of the transfer mold resin.

12 Claims, 10 Drawing Sheets

(56) References Cited

U.S. PATENT DOCUMENTS

| | | | |
|---|---|---|---|
| 6,509,629 B2* | 1/2003 | Yoshimatsu et al. | 257/660 |
| 6,914,321 B2* | 7/2005 | Shinohara | 257/678 |
| 6,979,843 B2* | 12/2005 | Nakajima et al. | 257/182 |
| 6,979,909 B2* | 12/2005 | Shinohara | 257/796 |
| 7,045,907 B2* | 5/2006 | Shinohara | 257/796 |
| 7,149,088 B2* | 12/2006 | Lin et al. | 361/704 |
| 7,190,070 B2 | 3/2007 | Manz et al. | |
| 7,367,716 B2* | 5/2008 | Nagano et al. | 385/89 |
| 7,750,463 B2* | 7/2010 | Osawa et al. | 257/723 |
| 7,755,185 B2* | 7/2010 | Bayerer et al. | 257/714 |
| 8,513,806 B2* | 8/2013 | Otsuka et al. | 257/751 |
| 2004/0070066 A1* | 4/2004 | Ogawa | 257/691 |
| 2005/0012190 A1 | 1/2005 | Manz et al. | |
| 2005/0093122 A9 | 5/2005 | Manz et al. | |
| 2007/0045801 A1* | 3/2007 | Sugiyama et al. | 257/684 |
| 2007/0090514 A1 | 4/2007 | Condie et al. | |
| 2007/0090515 A1* | 4/2007 | Condie et al. | 257/704 |
| 2008/0079145 A1* | 4/2008 | Tschirbs et al. | 257/706 |
| 2010/0133684 A1* | 6/2010 | Oka et al. | 257/712 |

FOREIGN PATENT DOCUMENTS

| | | |
|---|---|---|
| EP | 1 119 037 A2 | 7/2001 |
| JP | 9-129822 | 5/1997 |
| JP | 9-331150 | 12/1997 |
| JP | 11-204693 | 7/1999 |
| JP | 2004-319992 | 11/2004 |
| JP | 2006-332291 | 12/2006 |
| JP | 2008-084978 | 4/2008 |
| JP | 2009-135406 | 6/2009 |
| JP | 2010-123914 | 6/2010 |
| JP | 2010-129868 | 6/2010 |
| JP | 2010-186931 | 8/2010 |
| JP | 2010-199622 | 9/2010 |

OTHER PUBLICATIONS

Office Action issued Nov. 26, 2013, in Japanese Patent Application No. 2011-129261 (with partial English-language translation of the Notice of Reason(s) for Rejection).

Combined Chinese Office Action and Search Report issued Jun. 6, 2014 in Patent Application No. 201210081415.7 (with partial English language translation).

* cited by examiner

F I G . 1 1
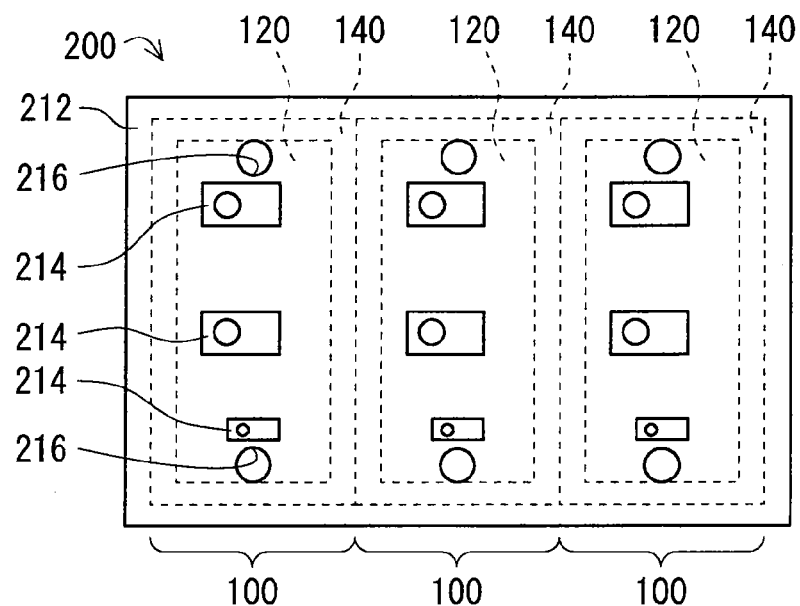
F I G . 1 2
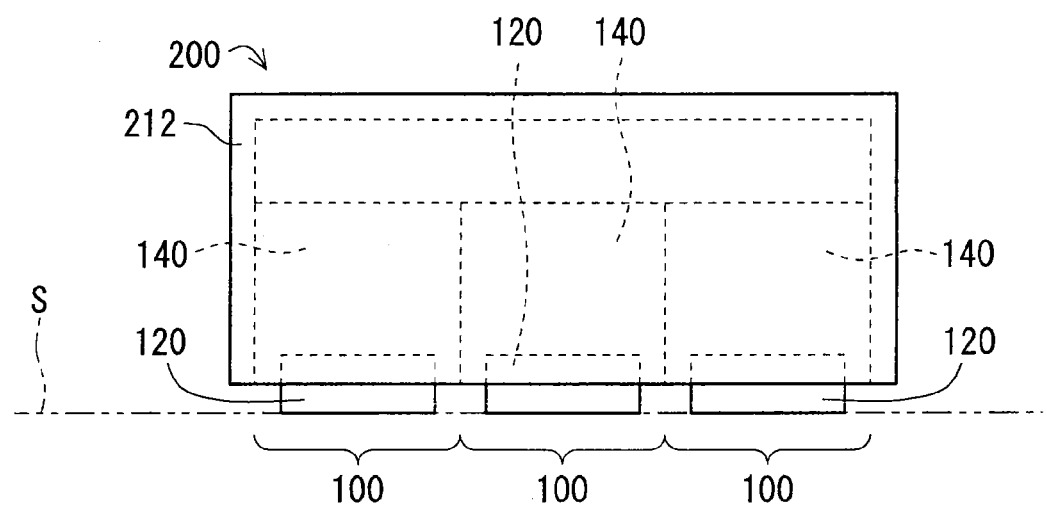

SEMICONDUCTOR DEVICE

BACKGROUND OF THE INVENTION

1. Field of the Invention

The present invention relates to a semiconductor device, and more particularly to a structure favorable to a power semiconductor device.

2. Description of the Background Art

<The First Conventional Art>

Case-type semiconductor devices have been conventionally known. In the case-type semiconductor device, a semiconductor chip (for example, a pair of an IGBT (Insulated Gate Bipolar Transistor) and a diode) and the like are accommodated in a package constituted of a Cu base plate and a case. More specifically, this type semiconductor device has an insulating substrate (which is formed of an insulating plate-like member (aluminum nitride, silicon nitride, alumina, or the like) with metal layers formed on both surfaces thereof), and a semiconductor chip and an electrode are soldered on the metal layer (forming a wiring pattern) formed on one surface of the insulating substrate. The metal layer formed on the other surface of the insulating substrate is soldered onto the Cu base plate. After that, the semiconductor chip and the like are electrically connected with a connecting wire such as an aluminum wire or the like. Then, the base plate and the case are bonded to each other by an adhesive. A resin (e.g., a silicone gel or a liquid epoxy resin) is injected into the package constituted of the Cu base plate and the case, and this seals the semiconductor chip and the like. After that, an electrode to be connected to the electrode inside the case is formed outside the case.

In such a structure, in a cooling process after soldering the insulating substrate onto the Cu base plate, the Cu base plate and the insulating substrate contract. The contraction due to cooling is referred to as cooling contraction. In a room temperature, with the cooling contraction, the insulating substrate warps convexly toward a side opposite to the Cu base plate and a tensile stress is exerted on an upper side (in other words, a side on which the semiconductor chip and the like are mounted) of the insulating substrate. This is because the coefficient of linear expansion of the Cu base plate is larger than that of the insulating substrate. Specifically, the coefficient of linear expansion of Cu is 17 ppm/° C. while the coefficient of linear expansion of aluminum nitride which is an exemplary material of the insulating plate-like member of which the insulating substrate is formed is 5.7 ppm/° C. The coefficient of linear expansion of silicon nitride which is another exemplary material of the insulating plate-like member is 3.2 ppm/° C. and that of alumina which is still another exemplary material of the insulating plate-like member is 6.5 ppm/° C. The amount of warp increases as the sizes of the insulating substrate and the Cu base plate become larger, and a crack occurs in the insulating substrate depending on circumstances.

Further, when the semiconductor chip generates heat due to energization, a crack sometimes occurs in a junction portion between the semiconductor chip and the connecting wire due to the difference in the coefficient of linear expansion between the semiconductor chip and the connecting wire. The occurrence of the crack degrades the reliability of the junction portion, in other words, the reliability of the semiconductor device. In order to increase the reliability of the junction portion, a complicated structure such as a stress buffer layer or the like may be introduced. The complication of the structure, however, does not meet the recent requirement for downsizing of the semiconductor device by reducing the area of the semiconductor chip.

<The Second Conventional Art>

The reliability of the junction portion between the semiconductor chip and the connecting wire can be improved by a transfer mold type semiconductor device. In this type semiconductor device, by using a resin having a coefficient of linear expansion lower than that of the liquid epoxy resin or the like used for the above-discussed case type semiconductor device, the semiconductor chip and the like are sealed by a transfer mold resin sealing method. With the transfer mold type, great adhesive strength can be achieved for components such as the semiconductor chip and the like.

In a semiconductor device disclosed in Japanese Patent Application Laid Open Gazette No. 9-129822, for example, a semiconductor chip is soldered onto one surface of a lead frame and an insulating substrate is soldered onto the other surface of the lead frame. After that, the semiconductor chip and the like are sealed with a transfer mold resin by the transfer mold method.

As the semiconductor device is upsized, however, the insulating substrate sometimes becomes liable to warp due to the curing contraction and the cooling contraction of the transfer mold resin. When a crack occurs in the insulating substrate due to the warp, the insulation of the semiconductor device cannot be ensured depending on circumstances.

Further, in the transfer mold type, an outer lead portion of the lead frame serves as a terminal of the device. Since the outer lead portion protrudes from a side surface of the semiconductor device, the semiconductor device is not easy to substitute for an already-existing product.

<The Third Conventional Art>

There is a case where high thermal conductive grease is applied to a package on which a power semiconductor device is mounted, and the power semiconductor device is mounted on the package and screwed thereinto. The thermal conductivity of the high thermal conductive grease is relatively higher than those of any other greases but is incommensurably lower those of metals. For this reason, when the high thermal conductive grease is thick, sufficient heat dissipation of the power semiconductor device cannot be achieved.

The thickness of the applied grease is determined in consideration of warp, waviness, and the like of opposed surfaces of the package and the semiconductor device. The thickness of the grease after the semiconductor device is mounted is also more than the sum of the warp and the waviness of the opposed surfaces of the package and the semiconductor device. In view of this point, various structures have been proposed to reduce the warp of the semiconductor device.

Further, when the warp, the waviness, and the like of the opposed surfaces of the package and the semiconductor device are too much larger, the semiconductor device warps when the semiconductor device is screwed into the package, and a crack sometimes occurs in the insulating substrate due to the warp. Also in order to solve the problem, various structures have been proposed.

In a structure disclosed in Japanese Patent Application Laid Open Gazette No. 2004-319992, for example, a base plate of each of partial modules has a recessed portion in a corner region thereof, and the partial modules are adjacently arranged so that the recessed portions may be confronted with each other. Then, a screw is threaded in a long hole formed by the confronted recessed portions, to thereby fix the partial modules to the package. With this structure, it is thought that the mounting area of each of the partial modules decreases and this suppresses the influence of the warp and the waviness. Since the adjacent partial modules share the screw, it is thought that it is possible to reduce the number of screws to be used. By sharing the screws, the number of portioned to be screwed, which is needed to fix n partial modules, is (2n+2).

Since the adjacent partial modules are fixed with the same screw, however, different axial forces are exerted on the partial modules even with the same amount of thread tightening, depending on the warp, the waviness, and the like of the partial modules and the warp, the waviness, and the like of the package on which the partial modules are mounted. In such a case, all the partial modules cannot be appropriately mounted.

Problems to be Solved by the Invention

In the first conventional art (the case type semiconductor device), as discussed above, in the cooling process after soldering the insulating substrate onto the Cu base plate, the insulating substrate sometimes warps. The amount of warp increases as the sizes of the insulating substrate and the Cu base plate become larger, and a crack occurs in the insulating substrate depending on circumstances.

Further, in the first conventional art, as discussed above, a crack sometimes occurs in the junction portion between the semiconductor chip and the connecting wire due to heat generation of the semiconductor chip, which is caused by energization. The occurrence of the crack degrades the reliability of the junction portion. In order to increase the reliability of the junction portion, a complicated structure such as the stress buffer layer or the like may be introduced, but this makes it difficult to meet the requirement for downsizing of the semiconductor device.

By the second conventional art (the transfer mold type semiconductor device), as discussed above, the reliability of the junction portion between the semiconductor chip and the connecting wire can be improved. Even in the transfer mold semiconductor device, however, the insulating substrate sometimes warps. Specifically, as discussed above, as the semiconductor device is upsized, the insulating substrate sometimes warps due to the curing contraction and the cooling contraction of the transfer mold resin. When a crack occurs in the insulating substrate due to the warp, the insulation of the semiconductor device cannot be ensured depending on circumstances.

Further, in the second conventional art, as discussed above, since the outer lead portion of the lead frame protrudes from the side surface of the semiconductor device, the semiconductor device is not easy to substitute for an already-existing product.

In the third conventional art (the technique disclosed in Japanese Patent Application Laid Open Gazette No. 2004-319992), as discussed above, since the adjacent partial modules are fixed with the same screw, different axial forces are exerted on the partial modules even with the same amount of thread tightening, depending on the warp, the waviness, and the like of the partial modules and the warp, the waviness, and the like of the package on which the partial modules are mounted. In such a case, all the partial modules cannot be appropriately mounted.

SUMMARY OF THE INVENTION

It is an object of the present invention to provide a technique to prevent any defects such as a warp, crack and the like, achieve appropriate and easy mounting, and so on.

According to an aspect of the present invention, the semiconductor device includes an insulating substrate having one main surface on which at least one semiconductor chip and at least one electrode are mounted, a base plate having one main surface joined to the other main surface of the insulating substrate, and a transfer mold resin which is so provided as to cover the one main surface of the base plate, the insulating substrate, the at least one semiconductor chip, and a junction end of the at least one electrode and expose the other main surface of the base plate. The coefficient of linear expansion of the base plate is lower than that of copper and the coefficient of linear expansion of the transfer mold resin is not higher than 16 ppm/° C. The transfer mold resin has such scooped shapes as to expose opposed short-side centers and the vicinity of the base plate, respectively. The base plate has mounting holes each penetrating the base plate in a thickness direction in portions exposed by the scooped shapes of the transfer mold resin.

According to the aspect of the present invention, the coefficient of linear expansion of the base plate is lower than that of copper and the coefficient of linear expansion of the transfer mold resin is not higher than 16 ppm/° C. This reduces warp due to various temperature factors, and it is consequently possible to prevent any crack of the insulating substrate and dielectric breakdown caused by the crack, or the like. Further, the base plate and the transfer mold resin described above prevent interfacial peeling between members.

With the reduction in the warp as discussed above, since the parallelism between the base plate and the mounting surface increases, the appropriate thickness of thermal conductive grease or an increase in the degree of contact between the base plate and the mounting surface is achieved, and therefore excellent heat conduction efficiency, in other words, excellent heat dissipation can be achieved. It is thereby possible to perform appropriate mounting.

Further, with the reduction in the warp as discussed above, even when only two portions are fixed with the two mounting holes, the parallelism between the base plate and the mounting surface is achieved and it is thereby possible to perform appropriate mounting. Needed number of fixtures are reduced, and the reduction in the number of fixtures leads to improvement of the workability of mounting and reduction in the cost of the fixtures. Further, with less number of fixing portions, the base plate becomes resistant to waviness, and this makes it possible to perform appropriate mounting.

The mounting holes of the base plate are provided near the opposed short-side centers, respectively. In other words, the mounting holes are provided at both ends of the longitudinal direction of the base plate. In view of the general fact that the amount of warp becomes larger as the size of the member increases, the two mounting holes are provided at favorable positions. Therefore, it is possible to ensure the parallelism between the base plate and the mounting surface and achieve appropriate mounting.

Further, with the partially scooped shapes of the transfer mold resin, the mounting holes of the base plate are exposed from the transfer mold resin. Therefore, it is possible to prevent the contact area between the transfer mold resin and the base plate, in other words, the adhesive strength between the transfer mold resin and the base plate from being largely reduced.

Since the mounting holes of the base plate are not shared by a plurality of semiconductor devices, there is no case where different axial forces are exerted on the semiconductor devices, which would be caused by the sharing of the fixtures by a plurality of semiconductor devices. This makes it possible to perform appropriate mounting.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a top view (plan view) illustrating a structure of the semiconductor device in accordance with the second preferred embodiment;

FIG. 12 is a side elevation illustrating the structure of the semiconductor device in accordance with the second preferred embodiment;

DESCRIPTION OF THE PREFERRED EMBODIMENTS

Though a power semiconductor device which is applied to, for example, drive control of a motor is taken as an example in the preferred embodiments, the following discussion will not be limited to the power semiconductor device.

The First Preferred Embodiment

Figure 1:
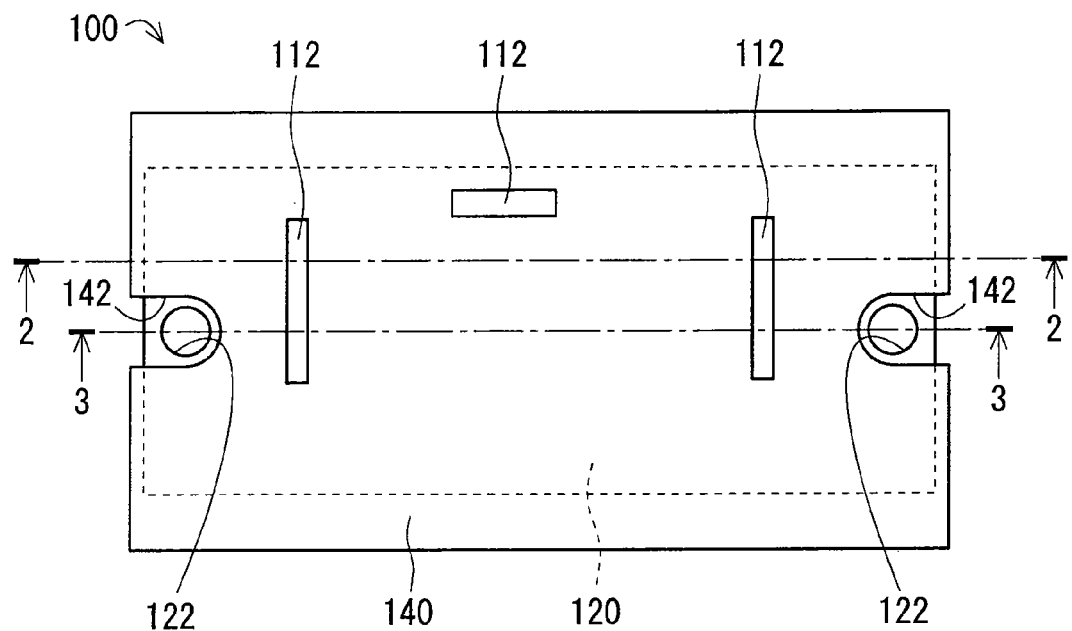
FIG. 1 is a top view (plan view) illustrating a structure of a semiconductor device in accordance with a first preferred embodiment of the present invention.
Figure 2:
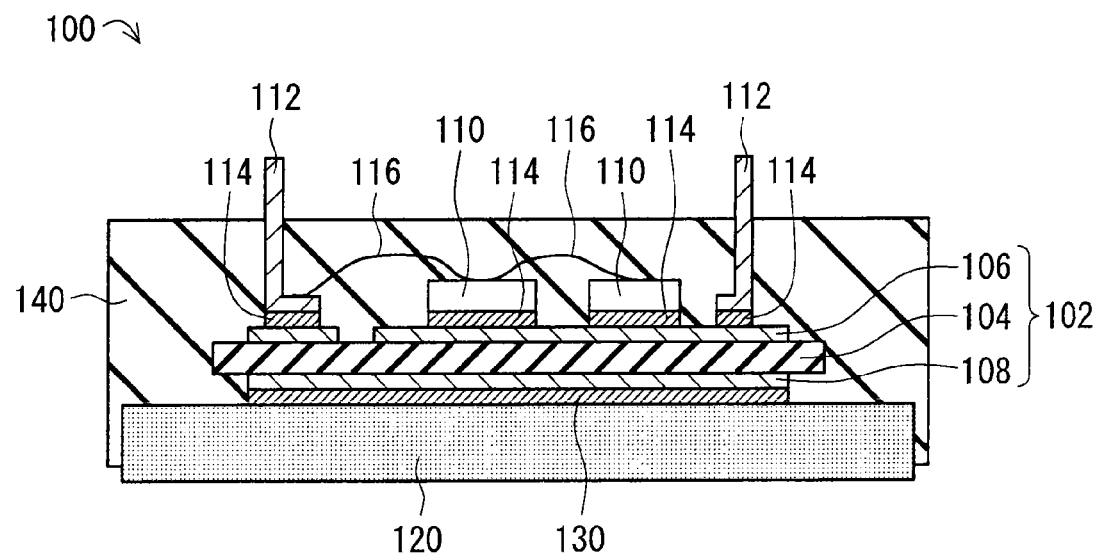
FIG. 2 is a cross section taken along the line 2-2 of FIG. 1.
Figure 3:
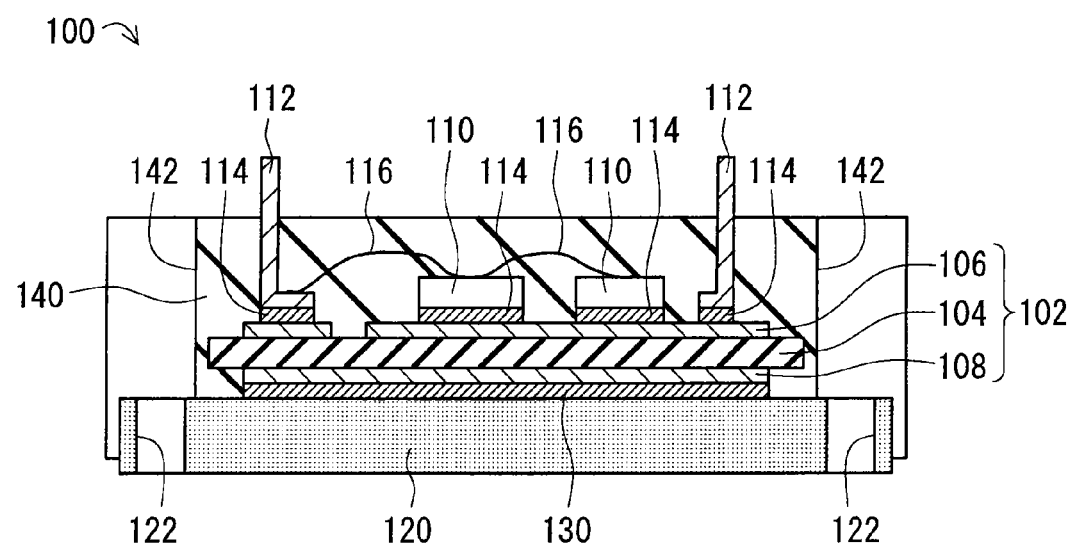
FIG. 3 is a cross section taken along the line 3-3 of FIG. 1.

FIG. 1 shows a top view (plan view) illustrating a structure of a semiconductor device 100 in accordance with the first preferred embodiment, FIG. 2 shows a cross section taken along the line 2-2 of FIG. 1, and FIG. 3 shows a cross section taken along the line 3-3 of FIG. 1. Hereinafter, in conformity with the fact that FIG. 1 is referred to as a "top view", the up and down direction of the semiconductor device 100 is defined. In this case, the up and down direction of FIGS. 2 and 3 corresponds to that of the semiconductor device 100. Further, hereinafter, the up and down (vertical) direction of the semiconductor device 100 is referred to as a "thickness direction".

The semiconductor device 100 includes an insulating substrate 102. In an exemplary case shown in the figures, the insulating substrate 102 includes an insulating plate-like member 104, a metal layer 106 formed on one main surface (herein, an upper main surface) of the insulating plate-like member 104, and a metal layer 108 formed on the other main surface (herein, a lower main surface) thereof.

The metal layer 106 on the side of the upper main surface is formed as a predetermined wiring pattern (not shown) in a plan view, and for this reason, the metal layer 106 is also referred to as a wiring pattern 106. The metal layer 108 on the side of the lower main surface have an arbitrary shape in a plan view and is entirely formed, for example, in a predetermined region. The insulating plate-like member 104 is formed of an insulating material such as ceramic (e.g., aluminum nitride, silicon nitride, and alumina), and the metal layers 106 and 108 are formed of metal materials such as copper or the like.

To the wiring pattern 106, joined are a semiconductor chip 110 and an electrode 112 which are exemplary circuit components, with a solder 114. In other words, the semiconductor chip 110 and the electrode 112 are mounted on one main surface (herein, an upper main surface) of the insulating substrate 102. The semiconductor chip 110 and electrode 112 are connected to predetermined portions with connecting wires 116 such as aluminum wires or the like, respectively, so as to form a predetermined circuit. The respective numbers of semiconductor chips 110, electrodes 112, and connecting wires 116 are not limited to those shown in the figures.

Herein, discussion will be made on an exemplary case where a power semiconductor element such as an IGBT (Insulated Gate Bipolar Transistor) or the like is integrated in the semiconductor chip 110. The semiconductor chip 110 may be formed by using silicon (Si) as a substrate, or may be formed by using a wide-gap semiconductor (silicon carbide (SiC), gallium nitride (GaN) based material, or the like) which has a bandgap wider than that of silicon, as a substrate.

The wide-gap semiconductor which has characteristics of high withstand voltage, high allowable current density, and the like is favorable to the power semiconductor element. Further, with these characteristics, the semiconductor chip 110 can be downsized as compared with the case of using a silicon substrate, and as a result, the semiconductor device 100 can be downsized. Further, all the semiconductor chips 110 may use the substrates of wide-gap semiconductor or only some of the semiconductor chips 110 may use the substrates of wide-gap semiconductor.

To the metal layer 108 on the side of the lower main surface, joined is a base plate 120 with a solder 130. In other words, the other main surface (herein, a lower main surface) of the insulating substrate 102 is joined to one main surface (herein, an upper main surface) of the base plate 120. Herein, one main surface of the base plate 120 and the other main surface (herein, a lower main surface) of the base plate 120 are flat surfaces (no step difference). A stacking direction of the base plate 120, the insulating substrate 102, and the semiconductor chip 110 corresponds to the up and down (vertical) direction (in other words, the thickness direction) of the semiconductor device 100.

The base plate 120 has such size and shape as to accommodate the insulating substrate 102 in a plan view and the insulating substrate 102 is so arranged as not to extend off the base plate 120 in the plan view. Herein, discussion will be made on an exemplary case where the shape of the base plate 120 in a plan view, in other words, the shape of the main surface is rectangle. Hereinafter, a side surface of the base plate 120 which is connected to a short side of the main surface (in other words, a side surface extending along a widthwise direction (short-side direction) of the base plate 120) is sometimes referred to as a short side surface, and a side surface connected to a long side of the main surface (in other words, a side surface extending along a longitudinal direction of the base plate 120) is sometimes referred to as a long side surface.

Since the base plate 120 serves as a radiator plate, the base plate 120 is formed of a material having high thermal conductivity. Materials such as copper (Cu), aluminum silicon carbide (AlSiC), copper molybdenum (CuMo), and the like may be adopted, and materials each of which have low coefficient of linear expansion, such as AlSiC, CuMo, and the like are more favorable than Cu, as discussed later.

The base plate 120 has two mounting holes 122 penetrating the base plate 120 in the thickness direction, as shown in FIGS. 1 and 3. In other words, the mounting holes 122 are formed across both the main surfaces of the base plate 120 in a direction orthogonal to the main surfaces. The mounting holes 122 are used to thread bolts in when the semiconductor device 100 is fixed onto a mounting portion (for example, a predetermined package, a heat sink, or the like) with the bolts. Each of the mounting holes 122 may have a thread groove or may not have any thread groove. The bolt is taken as an example of a fixture, but other fixtures such as a screw and the like may be used.

The two mounting holes 122 are provided near opposed short-side centers of the main surface of the base plate 120 (in other words, near centers of opposed short side surfaces), respectively. In this case, the two mounting holes 122 are aligned in the longitudinal direction of the base plate 120 with a center point positioned therebetween.

The semiconductor chip 110 and the like on the insulating substrate 102 are sealed with a transfer mold resin 140. More specifically, the transfer mold resin 140 covers the insulating substrate 102, the semiconductor chip 110, a junction end of the electrode 112 (an end portion of the electrode 112 which is joined to the insulating substrate 102), and the connecting wire 116. Further, the transfer mold resin 140 covers the upper main surface of the base plate 120 (the mounting holes 122, however, are exposed), and does not cover the lower main surface of the base plate 120 (in other words, the lower main surface is exposed from the resin 140). Though the transfer mold resin 140 extends from the upper main surface of the base plate 120 to the side surfaces (the short side surfaces and the long side surfaces) of the base plate 120 in the exemplary case shown in the figures, there may be a case where the transfer mold resin 140 is not formed on the side surfaces of the base plate 120.

The electrode 112 extends in a direction orthogonal to the insulating substrate 102, and a lower portion of the electrode 112 (i.e., the junction end) is buried in the transfer mold resin 140 and au upper portion of the electrode 112 protrudes from an upper surface of the transfer mold resin 140 (a surface positioned above the upper main surface of the insulating substrate 102). For this reason, unlike the structure of the second conventional art where the outer lead protrudes from a side surface of the transfer mold resin, the semiconductor device 100 is easy to substitute for an already-existing case-type product.

The transfer mold resin 140 has a substantially rectangular shape surrounding the base plate 120 in a top view (i.e., in a plan view, see FIG. 1) but is so formed as not to close the mounting holes 122 of the base plate 120 as shown in FIGS. 1 and 3. More specifically, the transfer mold resin 140 is formed except inside and above the mounting holes 122 and on regions in the upper main surface and the short side surfaces of the base plate 120 which are positioned near the mounting holes 122.

Therefore, as shown in FIG. 1, the transfer mold resin 140 has scooped shapes near the mounting holes 122 so that the mounting holes 122 can be exposed. The scooped shapes 142 extend up to the upper surface of the transfer mold resin 140. The scooped shapes 142 can be formed, for example, by shape design of a mold die for the transfer mold resin 140.

The semiconductor device 100 is arranged with the lower main surface (in other words, an exposed main surface) of the base plate 120 facing the mounting portion (for example, the predetermined package, the heat sink, or the like) and fixed to the mounting portion with the bolts threaded in the mounting holes 122. At that time, thermal conductive grease is applied to either or both of the exposed main surface of the base plate 120 and a surface of the mounting portion (i.e., a mounting surface). Further, when the calorific value of the semiconductor device 100 is small, the application of the thermal conductive grease may be omitted.

Herein, a material for the base plate 120 will be described.

Figure 4:
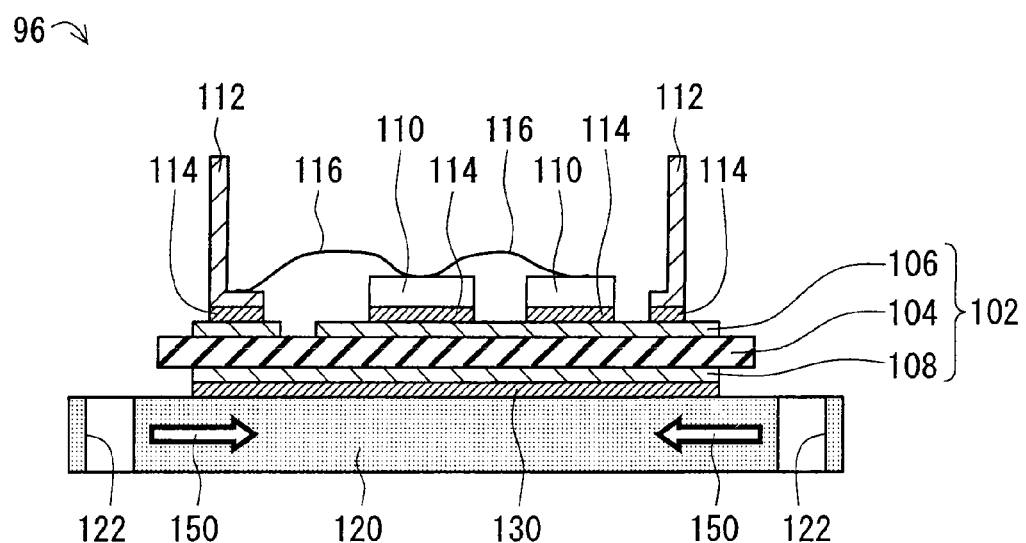
FIG. 4 is a cross section for explanation of the contraction of a base plate.

FIG. 4 is a cross section illustrating a structure of the semiconductor device 100 which is being manufactured. Specifically, FIG. 4 shows a manufacturing intermediate (in other words, an intermediate product) 96 with the semiconductor chip 110, the base plate 120, and the like soldered onto the insulating substrate 102. FIG. 4 corresponds to FIG. 3.

After the soldering process, a cooling process is performed. In the cooling process, the base plate 120 of the intermediate product 96 contracts. Such contraction due to cooling is referred to as cooling contraction. The arrows 150 in FIG. 4 schematically represent the cooling contraction of the base plate 120.

Figure 5:
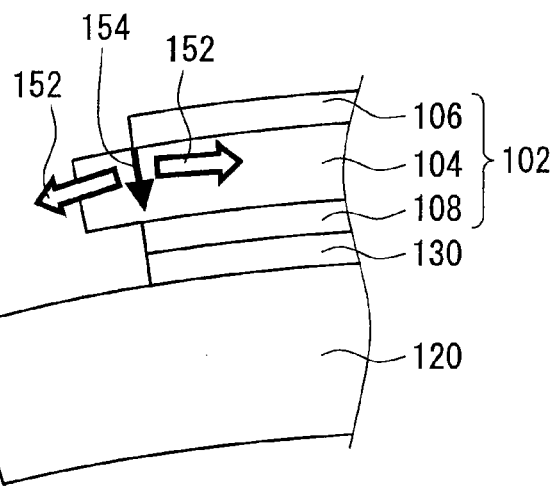
FIG. 5 is a schematic view for explanation of the manner in which a crack occurs in an insulating substrate due to the contraction of the base plate.

Since the base plate 120 and the insulating substrate 102 (more specifically, the insulating plate-like member 104) have different coefficients of linear expansion, a joined body of the base plate 120 and the insulating substrate 102 exhibits a behavior like that of a so-called bimetallic structure in response to the temperature (in other words, the heat). Specifically, when the base plate 120 has a coefficient of linear expansion higher than that of the insulating plate-like member 104, the base plate 120 warps convexly toward the insulating substrate 102 due to the cooling contraction of the base plate 120. In the insulating plate-like member 104, a tensile stress 152 is caused by the warp. As a result, a crack 154 sometimes occurs in the insulating plate-like member 104. FIG. 5 shows an exemplary case where a crack 154 occurs near an outermost periphery of the wiring pattern 106 in the upper main surface of the insulating plate-like member 104.

In view of this point, it is preferable that the base plate 120 should be formed of a material having a lower coefficient of linear expansion. Since Cu has a coefficient of linear expansion of about 17 ppm/° C., AlSiC has a coefficient of linear expansion of about 7.5 ppm/° C., and CuMo has a coefficient of linear expansion of about 7.5 ppm/° C., for example, AlSiC and CuMo can more reduce the above warp of the base plate 120 than Cu. Generally, by forming the base plate 120 of a material which has a coefficient of linear expansion lower than that of Cu which has been conventionally used as a material for base plates, it is possible to prevent the occurrence of the crack in the insulating substrate 102 and further prevent dielectric breakdown or the like from being caused by the crack. Especially, since the warp becomes larger as the base plate is upsized, the base plate 120 having a low coefficient of linear expansion is favorable to upsizing.

The warp of the base plate 120 and the insulating substrate 102 is not always caused by the cooling contraction in the manufacturing process. Also in the semiconductor device 100 after being manufactured, a warp sometimes occurs in the base plate 120 and the insulating substrate 102 due to, for example, the heat generation caused by energization or the difference in the coefficient of linear expansion. With the base plate 120 having a low coefficient of linear expansion, it is possible to produce the same effect as above also after the manufacturing process.

Next, a material for the transfer mold resin 140 will be discussed.

Table 1 shows a result of stress analysis on the peeling in the interface between the insulating substrate 102 (more specifically, the insulating plate-like member 104) and the transfer mold resin 140 and the peeling in the interface between the base plate 120 and the transfer mold resin 140. In Table 1, shown are exemplary cases where AlSiC and Cu are used as the material for the base plate 120 and 10 ppm/° C., 13 ppm/° C., and 16 ppm/° C. are taken as the coefficients of linear expansion of the transfer mold resin 140.

TABLE 1

Values of Stress Exerted in Direction of Interfacial Peeling
(Relative Values with Peeling Occurrence Critical Stress as 100%)

| Material for Base Plate | Interface | Coefficient of Linear Expansion of Mold Resin (ppm/° C.) | | |
|---|---|---|---|---|
| | | 10 | 13 | 16 |
| AlSiC | Insulating Substrate - Resin | 42% | 59% | 78% |
| | Base Plate - Resin | 28% | 50% | 76% |
| Cu | Insulating Substrate - Resin | 124% | 136% | 149% |
| | Base Plate - Resin | 111% | 95% | 100% |

In Table 1, index values expressed in percentage each represent the magnitude of the stress exerted in a direction of interfacial peeling. More Specifically, the index values in Table 1 are the values of the stress exerted in the direction of the interfacial peeling (which are obtained from the analysis using a structural model of the semiconductor device 100) which is relatively expressed with the critical stress value for occurrence of the peeling (hereinafter, referred to also as a "peeling occurrence critical stress") as 100%. When the index value is 100%, for example, it is indicated that the stress which corresponds to the peeling occurrence critical stress is exerted on the interface and there is a possibility of occurrence of the peeling. The index value larger than 100%, for example indicates that the peeling occurs due to the stress exceeding the peeling occurrence critical stress. In other words, as the index value becomes smaller, the possibility of the occurrence of the interfacial peeling decreases and this is preferable.

It can be seen from Table 1 that in both the two types of interfaces, the index values for the base plate 120 formed of AlSiC are smaller than the index values for the base plate 120 formed of Cu. In other words, it is harder to cause the peeling in both the two types of interfaces of the base plate 120 formed of AlSiC. Also from the viewpoint of Table 1, the base plate 120 formed of AlSiC is preferable to that formed of Cu. Further, CuMo has the same tendency as that of AlSiC.

It can be also seen from Table 1 that as the coefficient of linear expansion of the transfer mold resin 140 becomes lower, the above index values decrease and it becomes harder to cause the peeling in both the two types of interfaces. Further, as the result of a test performed by simulating the cold thermal fatigue in markets (so-called heat cycle test), it is verified that especially when the coefficient of linear expansion of the transfer mold resin 140 is not higher than 16 ppm/° C., the stress can be reduced in both the two types of interfaces and almost no interfacial peeling occurs.

Especially when the semiconductor chip 110 is formed by using the wide-gap semiconductor as a substrate, the structure of the semiconductor device 100 is favorable. This is because the semiconductor chip 110 using the wide-gap semiconductor can operate at higher temperature as compared with the semiconductor chip 110 using silicon. More specifically, the temperature difference in heat cycle increases in such a high temperature operation, and the stress is liable to increase in the interface between the base plate 120 and the transfer mold resin 140, the interface between the insulating substrate 102 and the transfer mold resin 140, and the like.

Figure 6:
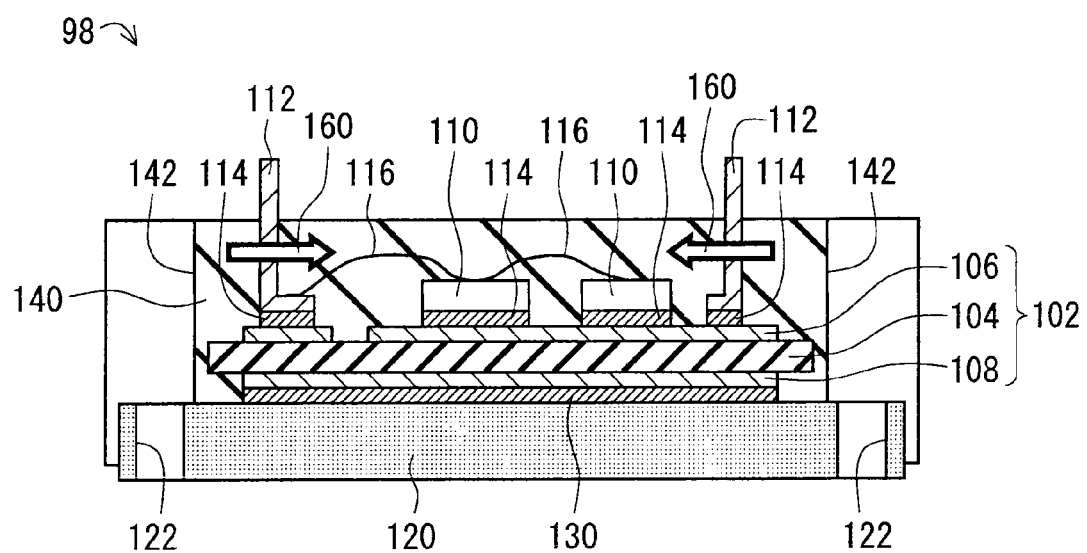
FIG. 6 is a cross section for explanation of the contraction of a transfer mold resin.
Figure 7:
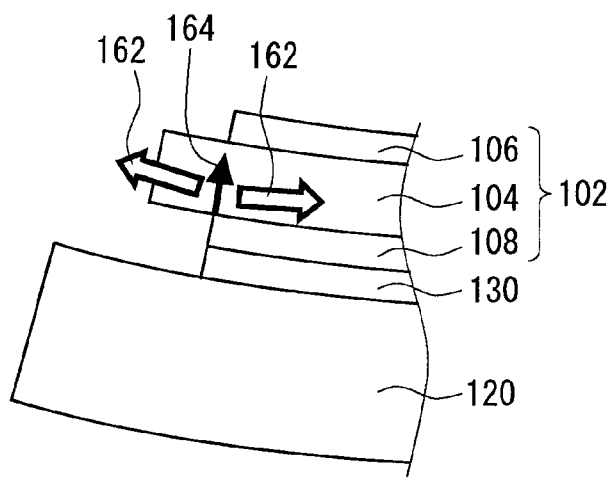
FIG. 7 is a schematic view for explanation of the manner in which a crack occurs in the insulating substrate due to the contraction of the transfer mold resin.

FIG. 6 is a cross section illustrating a structure of an intermediate product 98 after being transfer molded. FIG. 6 corresponds to FIGS. 3 and 4. The transfer mold resin 140 contracts as it becomes cured and also contracts as it is cooled from the temperature of the die (e.g., 170 to 180° C.) to room temperature. The arrows 160 in FIG. 6 schematically represent the contraction of the transfer mold resin 140. The contraction of the transfer mold resin 140 can cause a convex warp of the insulating substrate 102 toward the base plate 120, as schematically shown in FIG. 7. In the insulating plate-like member 104, a tensile stress 162 is caused by the warp. As a result, a crack 164 sometimes occurs in the main surface of the insulating plate-like member 104 on the side of the base plate.

With the transfer mold resin 140 having a coefficient of linear expansion of 16 ppm/° C. or lower, however, it is possible to suppress the above contraction 160 and reduce the warp of the insulating plate-like member 104. As a result, it is possible to prevent the occurrence of the crack in the insulating substrate 102 and further prevent dielectric breakdown or the like from being caused by the crack. Especially in the semiconductor device adopting the sealing with the transfer mold resin, the above curing contraction and the cooling contraction become larger as the device is upsized. In view of the fact, the transfer mold resin 140 having a coefficient of linear expansion of 16 ppm/° C. or lower is favorable to upsizing.

The warp of the base plate 120 and the insulating substrate 102 is not always caused by the curing contraction and the cooling contraction of the transfer mold resin 140 in the manufacturing process. Also in the semiconductor device 100 after being manufactured, a warp sometimes occurs in the base plate 120 and the insulating substrate 102 due to, for example, the heat generation caused by energization or the difference in the coefficient of linear expansion. With the transfer mold resin 140 having a coefficient of linear expansion of 16 ppm/° C. or lower, it is possible to produce the same effect as above also after the manufacturing process.

When the warp of the insulating substrate 102 is reduced by the transfer mold resin 140 having a coefficient of linear expansion of 16 ppm/° C. or lower, the warp of the base plate 120 which is joined to the insulating substrate 102 is also reduced. Further, as discussed above, by decreasing the coefficient of linear expansion of the base plate 120, it is possible to reduce the warp of the base plate 120. With reduction in the warp of the base plate 120, the parallelism between the lower main surface (in other words, the exposed main surface) of the base plate 120 and the mounting surface increases. Accordingly, it is possible to reduce in-plane unevenness of the thickness of thermal conductive grease applied between the exposed main surface of the base plate 120 and the mounting surface. Therefore, with the thermal conductive grease having a uniform and appropriate thickness, it is possible to achieve excellent heat conduction efficiency and as a result, it is possible to achieve excellent heat dissipation. In other words, appropriate mounting can be achieved.

Also when the thermal conductive grease is not used, the increase in the parallelism between the exposed main surface of the base plate 120 and the mounting surface leads to an increase in the degree of contact between the two surfaces. Therefore, it is possible to achieve excellent heat dissipation and perform appropriate mounting.

When there is a large warp in a base plate, generally, in order to ensure the parallelism between the exposed main surface of the base plate and a mounting surface, the base plate is fixed on the mounting surface by using a large number of bolts. On the other hand, in the semiconductor device 100, since the warp of the base plate 120 is reduced, the parallelism between the exposed main surface of the base plate 120 and the mounting surface can be ensured even when the fixing is made at two portions with the mounting holes 122. In other words, it is possible to achieve appropriate mounting. Therefore, needed number of bolts are reduced, and the reduction in the number of bolts leads to improvement of the workability of mounting and reduction in the cost of the bolts.

Further, generally, as the number of fixing portions increases, waviness becomes liable to occur in the base plate when the base plate expands with heat caused by energization, and as a result, the parallelism between the exposed main surface of the base plate and the mounting surface decreases. On the other hand, since the base plate 120 in the semiconductor device 100 has a low coefficient of linear expansion and is fixed at only two portions, the base plate 120 becomes resistant to waviness. Therefore, it is possible to maintain appropriate mounting even in use.

The two mounting holes 122 of the base plate 120 are provided near the opposed short-side centers, respectively. In other words, the mounting holes 122 are provided at both ends of the longitudinal direction of the base plate 120. In view of the general fact that the amount of warp becomes larger as the size of the member increases, the two mounting holes 122 are provided at positions favorable to coping with the remaining warp in the manufacturing process and the warp due to the heat caused by energization. Therefore, it is possible to ensure the parallelism between the exposed main surface of the base plate 120 and the mounting surface and achieve appropriate mounting.

The transfer mold resin 140 is so provided as to expose the mounting holes 122. Therefore, the contact area (in other words, adhesive area) between the transfer mold resin 140 and the base plate 120 decreases as compared with a case where the base plate 120 has no mounting hole 122. With the transfer mold resin 140, however, since the mounting holes 122 are exposed by the partially scooped shapes 142, the reduction in the contact area is suppressed. Therefore, it is possible to prevent the adhesive strength between the transfer mold resin 140 and the base plate 120 from being largely reduced.

Since the mounting holes 122 of the base plate 120 are not shared by a plurality of semiconductor devices 100, a plurality of semiconductor devices 100 do not share the fixing bolts. Therefore, unlike in the third conventional art (the technique disclosed in Japanese Patent Application Laid Open Gazette No. 2004-319992) where adjacent partial modules are fixed by the same screw, there is no case where different axial forces are exerted on the partial modules. This makes it possible to perform appropriate mounting.

When the insulating substrate 102 convexly warps downward due to the curing contraction and the cooling contraction of the transfer mold resin 140, a crack 164 is liable to occur immediately below the outermost periphery of the wiring pattern 106 and the vicinity (see FIG. 7). This is because with the warp of the insulating substrate 102, the tensile stress exerted by the insulating plate-like member 104 and the wiring pattern 106 becomes maximum in a portion immediately below the outermost periphery of the wiring pattern 106 and the vicinity.

Figure 8:
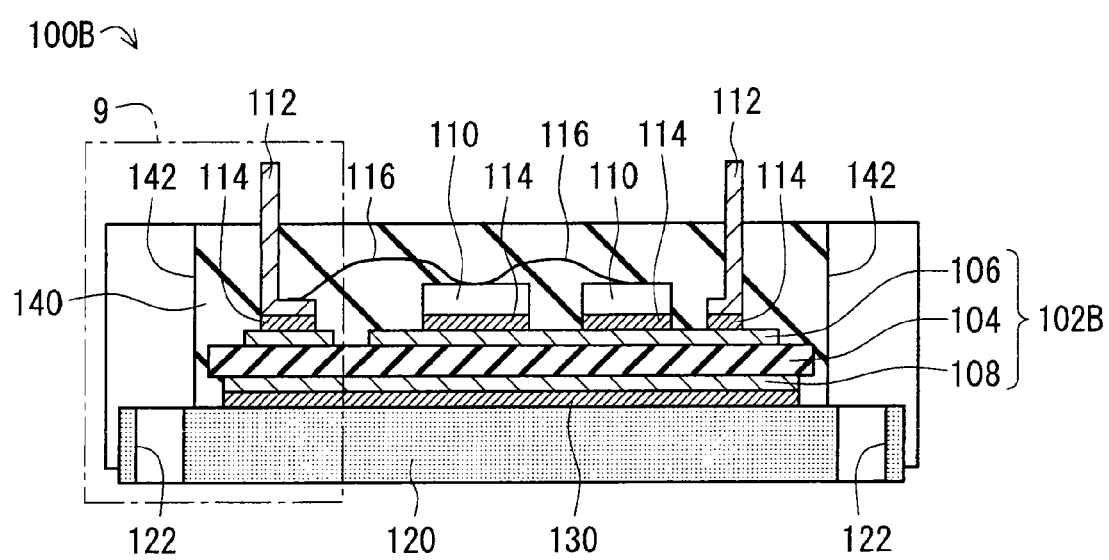
FIG. 8 is a cross section illustrating another structure of the semiconductor device in accordance with the first preferred embodiment.
Figure 9:
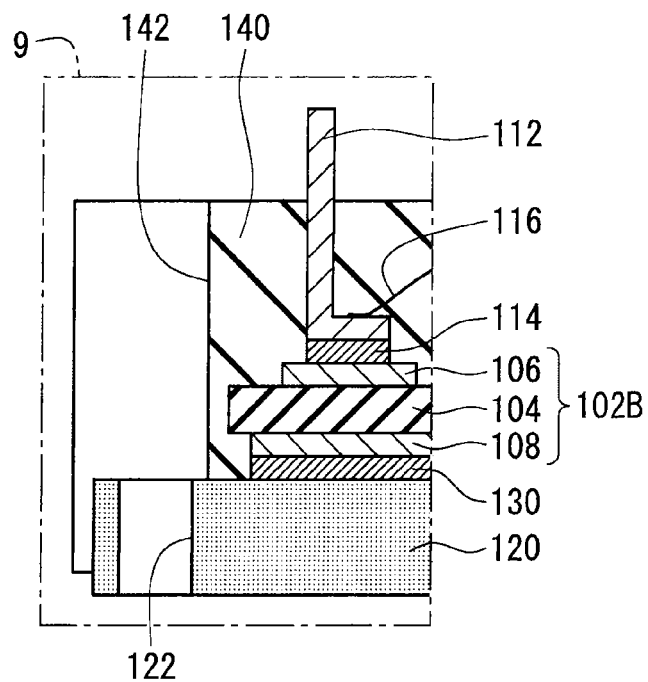
FIG. 9 is an enlarged view of a portion 9 surrounded by the one-dot chain line in FIG. 8.

FIG. 8 illustrates a structure by which the crack 164 can be prevented. FIG. 8 corresponds to FIG. 3. FIG. 9 is an enlarged view of a portion 9 surrounded by one-dot chain line in FIG. 8. A semiconductor device 100B shown in FIGS. 8 and 9 has a structure in which the insulating substrate 102 in the above-discussed semiconductor device 100 (see FIG. 3 and the like) is replaced by an insulating substrate 102B. The other constituent elements of the semiconductor device 100B other than the above are basically the same as those of the semiconductor device 100.

As shown in FIGS. 8 and 9, in the insulating substrate 102B, the metal layer 108 on the side of the lower main surface extends outward as compared with the wiring pattern 106 on the side of the lower main surface. (In other words, the metal layer 108 extends toward the side of the edge of the insulating plate-like member 104.) For this reason, the portion immediately below the outermost periphery of the wiring pattern 106 and the vicinity are covered with the metal layer 108. Therefore, it is possible to relieve the tensile stress in the lower main surface (in other words, on the side of the base plate 120) and prevent the occurrence of the crack 164.

Further, by enlarging a range in which the metal layer 108 on the side of the lower main surface is to be formed, even in a low-temperature ambient (e.g., −40° C.) which is often included in use conditions, it is possible to prevent any crack from occurring and achieve high reliability.

The Second Preferred Embodiment

Figure 10:
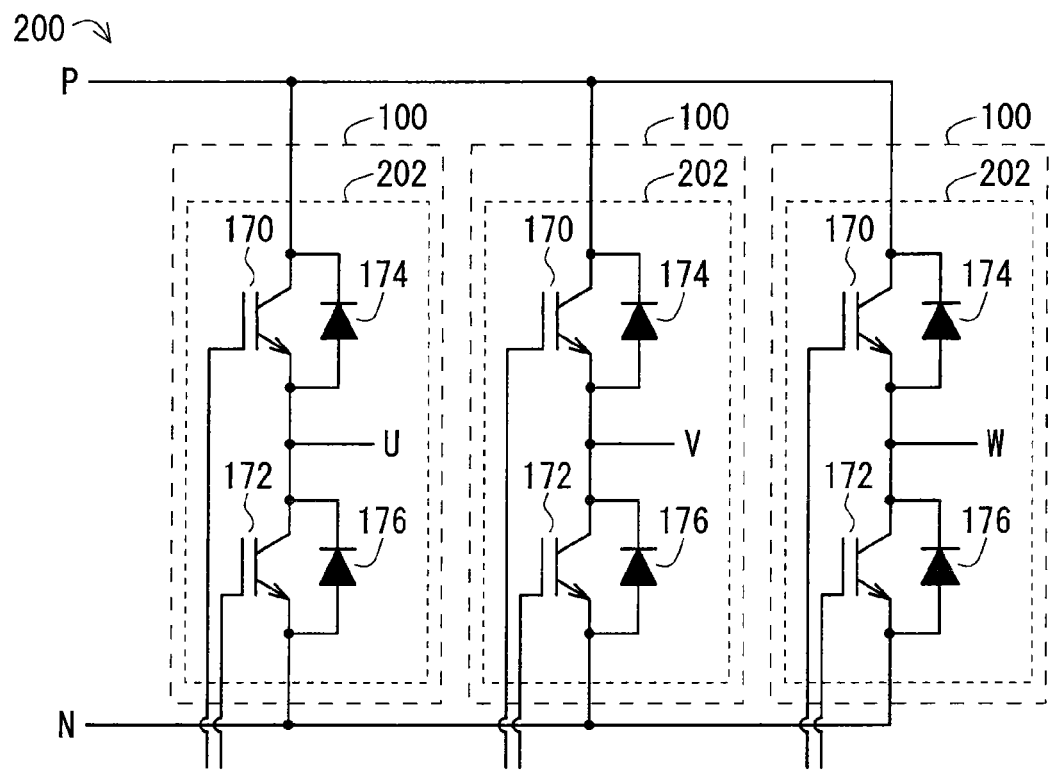
FIG. 10 is a circuit diagram illustrating a circuit configuration of a semiconductor device in accordance with a second preferred embodiment of the present invention.

FIG. 10 is a circuit diagram illustrating a circuit configuration of a semiconductor device 200 in accordance with the second preferred embodiment, and FIGS. 11 and 12 are a top view (plan view) and a side elevation illustrating the semiconductor device 200, respectively. As shown in FIG. 10, the semiconductor device 200 has three circuit units 202 and each of the circuit units 202 is formed of the semiconductor device 100 of the first preferred embodiment. Further, each of the circuit units 202 may be formed of the semiconductor device 100B (see FIGS. 8 and 9) which is taken as another example of the first preferred embodiment. Hereinafter, the semiconductor devices 100 and 100B are sometimes referred to as semiconductor units 100 and 100B, respectively.

With reference to FIG. 10, an exemplary circuit of the semiconductor device 200 will be discussed. As discussed above, the semiconductor device 200 has three circuit units 202. Though an exemplary case where the three circuit units 202 have the same circuit configuration will be discussed herein, this is one exemplary case. Further, the semiconductor device 200 may include two circuit units 202 or at least four circuit units 202.

Each of the circuit units 202 has IGBTs 170 and 172 and diodes 174 and 176. The IGBTs 170 and 172 are connected in series between a high potential-side terminal P (referred to also as a "P terminal") and a low potential-side terminal N (referred to also as an "N terminal"). The diode 174 is connected in inverse parallel to the IGBT 170 and the diode 176 is connected in inverse parallel to the IGBT 172. The diodes 174 and 176 are so-called free wheeling diodes.

More specifically, a collector of the IGBT 170 is connected to the high potential-side terminal P, an emitter of the IGBT 170 is connected to a collector of the IGBT 172, and an emitter of the IGBT 172 is connected to the low potential-side terminal N. A cathode of the diode 174 is connected to the collector of the IGBT 170 and an anode of the diode 174 is connected to the emitter of the IGBT 170. Similarly, a cathode of the diode 176 is connected to the collector of the IGBT 172 and an anode of the diode 176 is connected to the emitter of the IGBT 172. An output terminal is connected to the emitter of the high-side IGBT 170, in other words, the collector of the low-side IGBT 172. The terminals P and N, corresponding to the output terminal, are referred to as input terminals.

In the exemplary case of FIG. 10, the circuit is configured so that gate timings of the total six IGBTs 170 and 172 can be controlled independently. More specifically, respective gates (i.e., control terminals) of the six IGBTs 170 and 172 are not connected to one another. Therefore, by controlling the respective gate timings of the IGBTs 170 and 172 so that, for example, phases of respective outputs of the three circuit units 202 can be shifted, the semiconductor device 200 can output three-phase outputs (e.g., three-phase alternating currents). In the exemplary case of FIG. 10, one circuit unit 202 is assigned to a U-phase output, another circuit unit 202 is assigned to a V-phase output, and the remaining one circuit unit 202 is assigned to a W-phase output.

The semiconductor device 200 may incorporate not-shown constituent elements such as a gate driving circuit, a protection circuit, and the like.

As discussed above, in the semiconductor device 200, each of the three circuit units 202 is formed of the semiconductor device 100 (i.e., the semiconductor unit 100) of the first preferred embodiment. In other words, the semiconductor device 200 has three semiconductor units 100.

In the exemplary case shown in FIGS. 11 and 12, the three semiconductor units 100 are aligned in one direction (in a transverse direction in FIGS. 11 and 12) so that the long side surfaces of the respective transfer mold resins 140 may be opposed to one another. Further, as illustrated in FIG. 11, the three semiconductor units 100 are aligned so that the short sides of the respective transfer mold resins 140 may be in the same plane. As illustrated in FIG. 12, the three semiconductor units 100 are aligned so that the exposed main surfaces of the respective base plates 120 may be in the same plane S. The adjacent semiconductor units 100 are fixed to each other by an adhesive at, for example, the opposed long side surfaces.

The three semiconductor units 100 aligned as discussed above are accommodated in an external case 212, being integrated with the external case 212. The three semiconductor units 100 are fixed to the external case 212 by, e.g., an adhesive. As shown in FIG. 12, however, the external case 212 does not cover the exposed main surfaces of the respective base plates 120 of the semiconductor units 100 and has such a shape as not to block contact of the exposed main surfaces of the respective base plates 120 of the semiconductor units 100 with the mounting surface (see the plane S in FIG. 12).

The external case 212 is simply shown in FIGS. 11 and 12, and the shape of the external case 212 is not limited to that shown in FIGS. 11 and 12. Further, though a case where there is a clearance above the transfer mold resins 140 in the external case 212 is shown in FIG. 12, the respective upper surfaces of the transfer mold resins 140 may come into contact with an inner surface of the external case 212.

As illustrated in FIG. 11, the external case 212 has electrodes 214 and mounting holes 216 in an upper surface thereof. In FIG. 12, the electrodes 214 and the like are not shown.

The electrodes 214 are provided correspondingly to the electrodes 112 (see FIG. 1 and the like) of the semiconductor unit 100, and each of the electrodes 214 is formed of a member connected to the corresponding electrode 112 inside the external case or a portion of the corresponding electrode 112 which protrudes outside the external case. Further, other electrodes which are not shown, such as the above-described terminals P and N (see FIG. 10), may be provided on the upper surface of the external case 212.

The mounting holes 216 of the external case 212 are provided correspondingly to the mounting holes 122 (see FIG. 1 and the like) of the semiconductor unit 100. In other words, two mounting holes 216 are provided for each of the semiconductor units 100. The corresponding mounting holes 216 and 122 are positioned concentrically. Therefore, by inserting a bolt through the two mounting holes 216 and 122 which are aligned concentrically, the semiconductor device 200 can be fixed to the mounting portion with the bolt.

Figure 13:
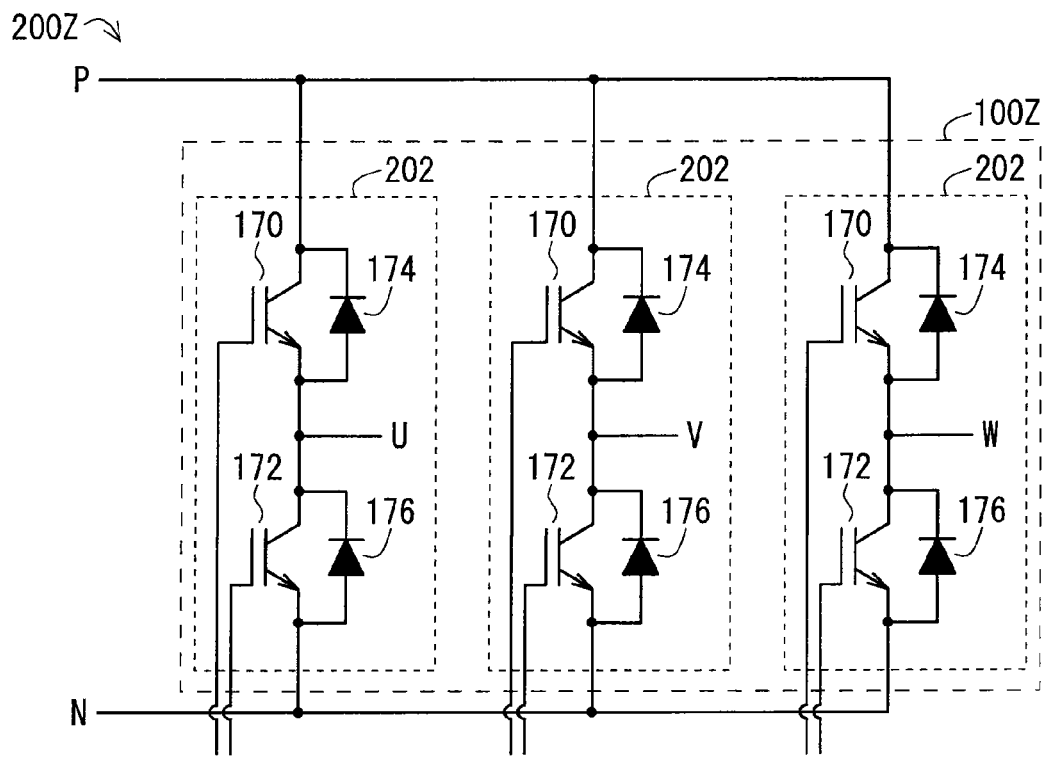
FIG. 13 is a circuit diagram illustrating a circuit configuration of a semiconductor device for comparison.
Figure 14:
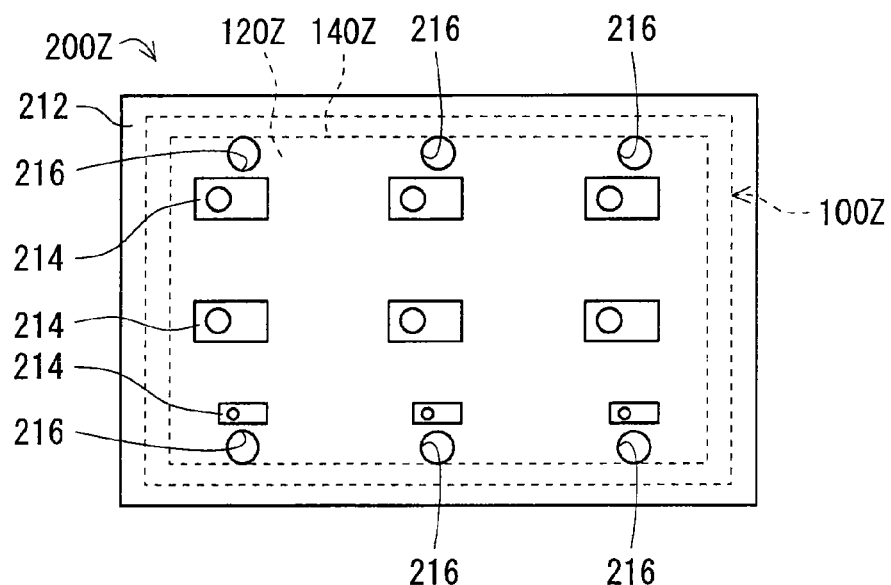
FIG. 14 is a top view (plan view) illustrating a structure of the semiconductor device for comparison.

FIGS. 13 and 14 are a circuit diagram and a top view (plan view), respectively, illustrating another semiconductor device 200Z used for comparison with the above-described semiconductor device 200. An entire circuit configuration of the semiconductor device 200Z is the same as that of the semiconductor device 200, but in the semiconductor device 200Z for comparison, the three circuit units 202 are integrated in a single semiconductor unit 100Z. More specifically, in the semiconductor unit 100Z, a single insulating substrate (which is not shown and corresponds to the insulating substrate 102) is joined onto a single base plate 120Z, circuit components are mounted on the single insulating substrate, and the circuit components and the single insulating substrate are sealed by a transfer mold resin 140Z. For the purpose of comparison, the semiconductor devices 200Z and 200 use the same external case 212.

As can be seen from the comparison between FIGS. 14 and 11, the single base plate 120Z has size and shape across an entire region in which the three base plates 120 of the above-discussed semiconductor device 200 are formed. The single base plate 120Z further has six mounting holes (which are not shown and correspond to the mounting holes 122 of the base plate 120) corresponding to the six mounting holes 216 of the external case 212.

In this case, the area of an exposed main surface (i.e., a lower main surface opposed to the mounting surface) of the single base plate 120Z of the semiconductor device 200Z for comparison is substantially equal to the total area of the exposed main surfaces of the three base plates 120 in the above-discussed semiconductor device 200. In other words, the area of the exposed main surface of each of the base plates 120 in the above-discussed semiconductor device 200 is substantially one third of the area of the exposed main surface of the single base plate 120Z of the semiconductor device 200Z for comparison. For this reason, by using the small base plates 120, the amount of warp can be reduced as compared with that of the single base plate 120Z for comparison.

Further, each of the base plates 120 is fixed at two portions with the two mounting holes 122 as discussed above while the single base plate 120Z for comparison is fixed at six portions.

For this reason, the waviness of the exposed main surface, which is caused by the fixing, can be more reduced in the base plate 120 provided for each of the semiconductor units 100.

As the result of these characteristics, in the semiconductor device 200 having the three divided semiconductor units 100, it is possible to achieve high parallelism between the exposed main surface of the base plate 120 and the mounting surface. Accordingly, it is possible to reduce unevenness of the thickness of the thermal conductive grease applied between the base plate 120 and the mounting surface. Therefore, with the thermal conductive grease having a uniform and appropriate thickness, it is possible to achieve excellent heat conduction efficiency, in other words, excellent heat dissipation. In other words, appropriate mounting can be achieved. Even when no thermal conductive grease is used, excellent heat dissipation can be achieved by high degree of contact between the exposed main surface of the base plate 120 and the mounting surface and appropriate mounting can be therefore achieved.

The other effects of the semiconductor unit 100 discussed in the first preferred embodiment can be also produced in the semiconductor device 200.

Figure 15:
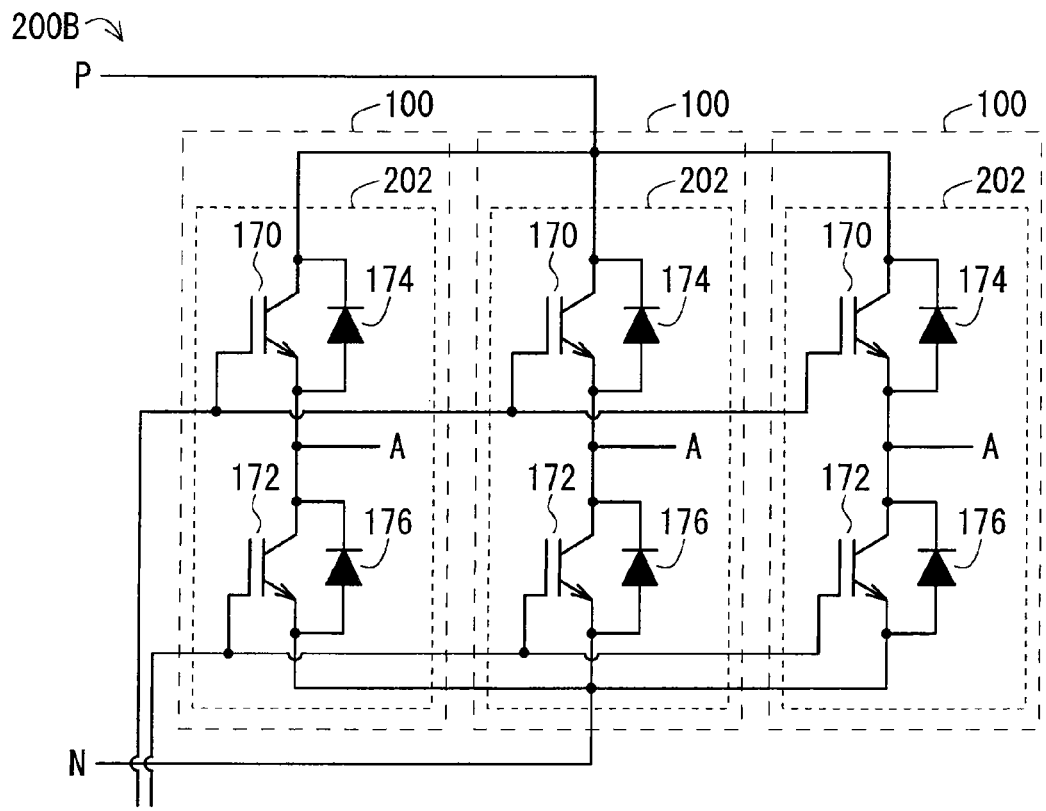
FIG. 15 is a circuit diagram illustrating another circuit configuration of the semiconductor device in accordance with the second preferred embodiment.

FIG. 15 is a circuit diagram illustrating a circuit configuration of another semiconductor device 200B in accordance with the second preferred embodiment. The semiconductor device 200B has basically the same circuit configuration and device structure as those of the above-discussed semiconductor device 200, but the gate timings of the IGBTs 170 and 172 are controlled so that the outputs of the circuit units 202 may have the same phase. In view of the outputs of the same phase, in the semiconductor device 200B, any one of the output terminals U, V, and W in the above-discussed semiconductor device 200 is referred to as an output terminal A.

More specifically, in an exemplary case of FIG. 15, the respective gates of the IGBTs 170 in the three circuit units 202 are connected in common to one another. Therefore, the same gate signal is inputted to the three IGBTs 170, and the three IGBTs 170 are thereby controlled at the same gate timing. Similarly, the respective gates of the IGBTs 172 in the three circuit units 202 are connected in common to one another. Therefore, the three IGBTs 172 are controlled at the same gate timing.

The IGBTs 170 may be connected to one another outside the external case 212 or may be connected to one another inside the external case 212. Similarly, the IGBTs 172 may be connected to one another outside the external case 212 or may be connected to one another inside the external case 212.

In the semiconductor device 200B, the three circuit units 202 are connected in parallel between the input terminals P and N and perform an output operation in the same phase. Therefore, a device of higher capacity can be provided as compared with the case of using only one circuit unit 202.

Further, since the semiconductor device 200B has the same structure as that of the semiconductor device 200 (see FIGS. 11 and 12), the semiconductor device 200B can produce the same effects as those of the semiconductor device 200.

The number of the circuit units 202 which are connected in parallel, in other words, the number of the semiconductor units 100 is not limited to three. Further, the semiconductor unit 100B may be adopted.

The Third Preferred Embodiment

Figure 16:
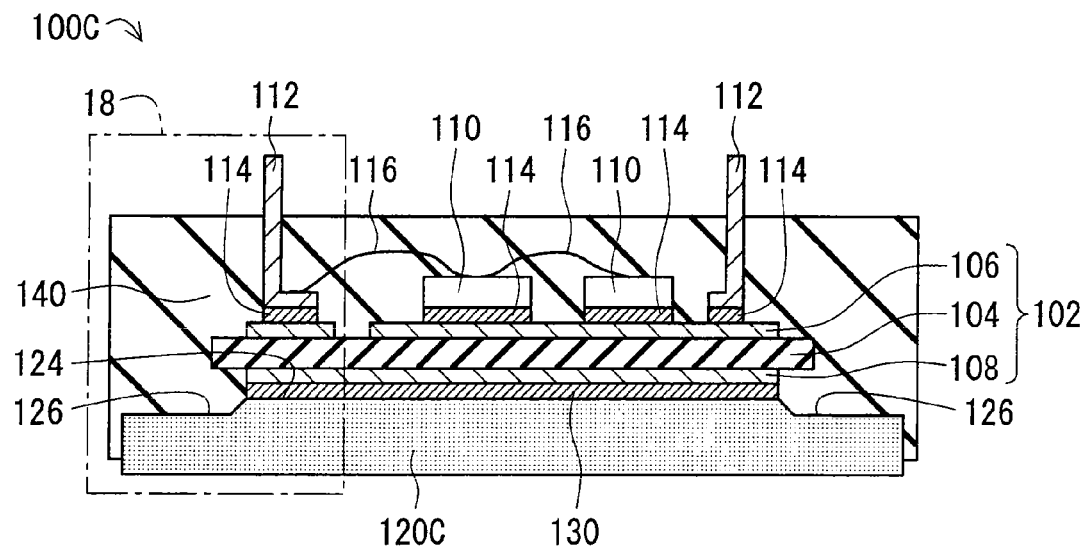
FIGS. 16 and 17 are cross sections each illustrating a structure of a semiconductor device in accordance with a third preferred embodiment of the present invention.
Figure 17:
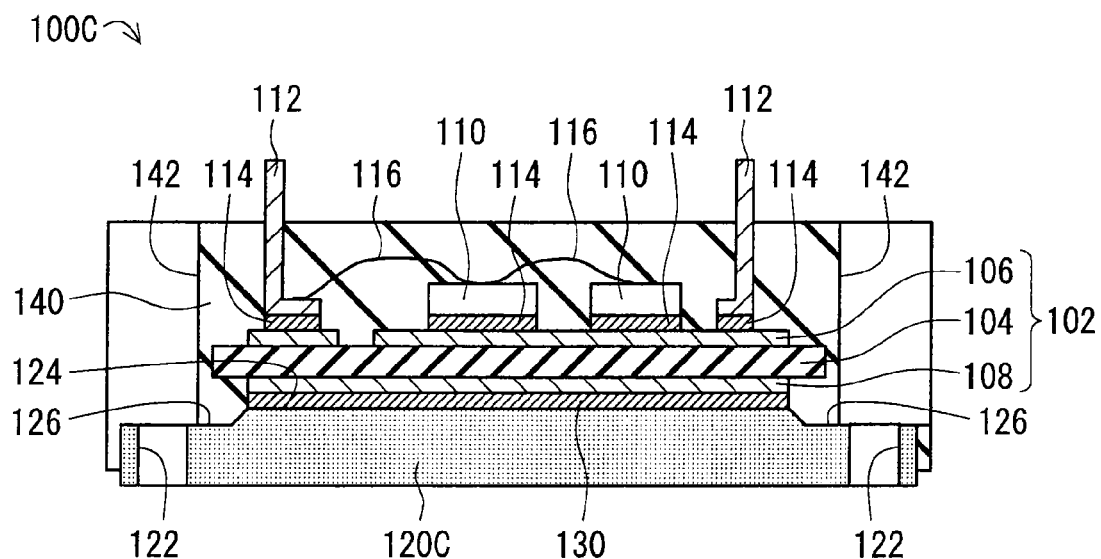
Figure 18:
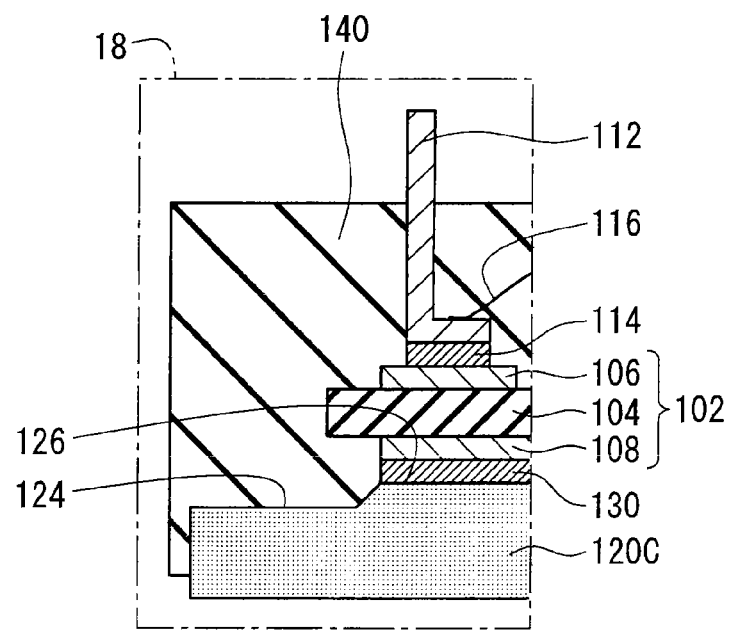
FIG. 18 is an enlarged view of a portion 18 surrounded by the one-dot chain line in FIG. 16.

FIGS. 16 and 17 are cross sections each illustrating a structure of a semiconductor device 100C in accordance with the third preferred embodiment. FIG. 16 corresponds to FIG. 2 and FIG. 17 corresponds to FIG. 3. FIG. 18 is an enlarged view of a portion 18 surrounded by the one-dot chain line in FIG. 16. The semiconductor device 100C illustrated in FIGS. 16 to 18 has a structure in which the base plate 120 in the above-discussed semiconductor device 100 of the first preferred embodiment (see FIGS. 2, 3 and the like) is replaced by a base plate 120C. The other constituent elements of the semiconductor device 100C other than the above are basically the same as those of the semiconductor device 100.

The base plate 120C is formed of the same material as that of the above-discussed base plate 120, but the base plate 120C is different from the base plate 120 in that an upper main surface (i.e., the main surface on the side of the insulating substrate 102) of the base plate 120C has step differences. A lower main surface of the base plate 120C (i.e., an exposed main surface) is a flat surface like that of the base plate 120.

Specifically, the upper main surface of the base plate 120C includes a junction region 124 which corresponds to a range to be joined to the insulating substrate 102, and a region 126 around the junction region 124. The surrounding region 126 is positioned on the side of the lower main surface of the base plate 120C as compared with the junction region 124. In other words, the surrounding region 126 is more retreated than the junction region 124. Therefore, in the base plate 120C, a portion below the surrounding region 126 is thinner than a portion below the junction region 124. Though a boundary portion between these regions 124 and 126 is an inclined surface in an exemplary case shown in FIGS. 16 to 18, the boundary portion may be, for example, a perpendicular surface.

In both the semiconductor devices 100C and 100, the metal layer 108 on the side of the lower main surface of the insulating substrate 102 does not reach an edge of the insulating plate-like member 104. For this reason, a peripheral portion of the insulating plate-like member 104 does not come into contact with the base plate 120 or 120C and there is a clearance between the peripheral portion of the insulating plate-like member 104 and the base plate 120 or 120C. The clearance can be broadened by adopting the base plate 120C, and with the broadened clearance, the transfer mold resin 140 easily goes round into the clearance. In other words, it becomes possible to more reliably to fill the transfer mold resin 140 below the insulating substrate 102. Since a portion which is not filled with the transfer mold resin 140 may cause stress concentration, by reliably fill the transfer mold resin 140 below the insulating substrate 102, it is possible to prevent the stress concentration. As a result, it is possible to prevent any crack from being caused by the stress concentration.

Further, with the broadened clearance, the amount of transfer mold resin 140 to be filled below the insulating substrate 102 increases. This increases a force to pull the peripheral portion of the insulating substrate 102 downward, in other words, to the side of the base plate 120C when the transfer mold resin 140 contracts due to being cured and cooled. With the increase of the force, it is possible to reduce the convex warp of the insulating substrate 102 toward the base plate 120C due to the contraction of the transfer mold resin 140 on the insulating substrate 102. As a result, it is possible to prevent any crack from occurring in the insulating substrate 102.

The other effects of the semiconductor unit 100 discussed in the first preferred embodiment can be also produced in the semiconductor device 100C. The base plate 120C can be applied to the semiconductor device 100B (see FIGS. 8 and 9). Further, the semiconductor device 200 or 200B can be formed of the semiconductor device 100C or the like which adopts the base plate 120C, as the semiconductor unit.

The Fourth Preferred Embodiment

In the fourth preferred embodiment, discussion will be made on the thickness of the transfer mold resin 140, and particularly on the thickness of the transfer mold resin 140 on the insulating substrate 102. Though the semiconductor device 100C of the third preferred embodiment is taken as an example herein, the following discussion can be applied to the other semiconductor device 100 and the like.

Figure 19:
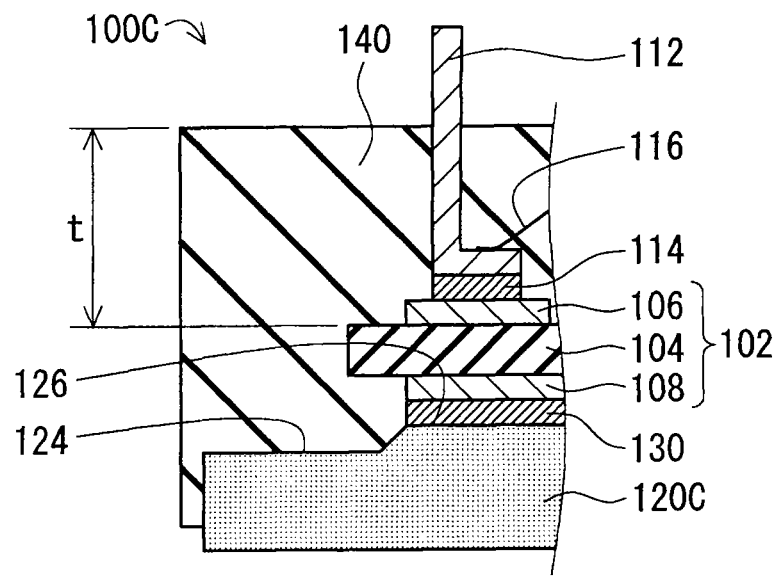
FIG. 19 is a cross section for explanation of a resin thickness in accordance with a fourth preferred embodiment of the present invention.

As shown in the cross section of FIG. 19, the thickness of the transfer mold resin 140 which is positioned on the insulating substrate 102 is represented by "t". In an exemplary case of FIG. 19, the thickness t of the resin (resin thickness) on the insulating substrate 102 is represented as the size between the upper main surface of the insulating plate-like member 104 and the upper surface of the transfer mold resin 140. Since the wiring pattern 106 is sufficiently thinner than the insulating plate-like member 104, however, the size between the upper surface of the wiring pattern 106 and the upper surface of the transfer mold resin 140 may be represented as the resin thickness t.

When the resin thickness t on the insulating substrate 102 is large, the interfacial peeling between the base plate 120C and the transfer mold resin 140, the interfacial peeling between the insulating substrate 102 and the transfer mold resin 140, or the crack of the insulating substrate 102 may be caused by the cold thermal fatigue in the markets.

In order to prevent such interfacial peeling and crack, it is preferable that the resin thickness t on the insulating substrate 102 should be not larger than 5 mm. With such a thickness, it is possible to suppress the warp, the stress, and the like caused by the difference in the coefficient of linear expansion between the transfer mold resin 140 and the base plate 120C or the like. As a result, it is possible to prevent the above-discussed interfacial peeling and crack.

Figure 20:
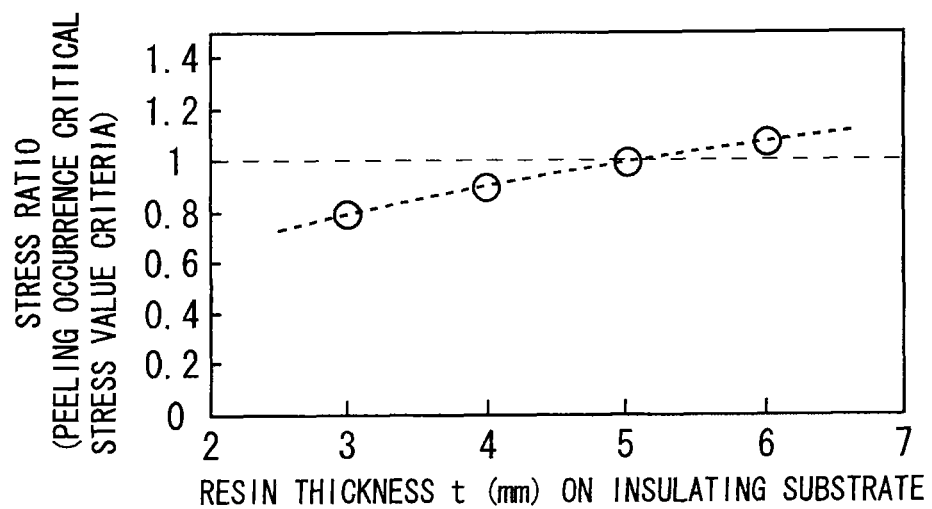
FIG. 20 is a graph for explanation of the resin thickness in accordance with the fourth preferred embodiment.

FIG. 20 is a graph showing the relation between the resin thickness t on the insulating substrate 102 and the stress in the interface between the insulating substrate 102 and the transfer mold resin 140. The stress in the interface between the insulating substrate 102 and the transfer mold resin 140 is obtained by the analysis using a structural model of the semiconductor device 100C. A value obtained by normalizing the analysis value with the peeling occurrence critical stress (the critical stress for the occurrence of the peeling), i.e., a value obtained by the calculation of (a stress value obtained from the analysis)/(the peeling occurrence critical stress) is represented as a "stress ratio" on the vertical axis of the graph.

In view of the calculation formula for obtaining the stress ratio, the stress ratio in the graph of FIG. 20 is equivalent to the index value in Table 1, and the stress ratio of "1" in FIG. 20, for example, corresponds to the index value of 100% in Table 1. Therefore, as the stress ratio in FIG. 20 becomes smaller, the possibility of interfacial peeling becomes smaller, and this is more preferable.

It can be seen from FIG. 20 that the stress ratio is not larger than 1 when the resin thickness t on the insulating substrate 102 is not larger than 5 mm. In other words, when the resin thickness t of the insulating substrate 102 is not larger than 5 mm, it is possible to prevent the interfacial peeling.

On the other hand, when the resin thickness t on the insulating substrate 102 is small, there is a possibility of occurrence of a crack in the transfer mold resin 140 due to the cold thermal fatigue in the markets.

In order to prevent the occurrence of the crack, it is preferable that the resin thickness t on the insulating substrate 102 is not smaller than 3 mm. With such a thickness, it is possible to suppress the stress and the like caused by the difference in the coefficient of linear expansion between the transfer mold resin 140 and the base plate 120C or the like. As a result, it is possible to prevent the occurrence of a crack in the transfer mold resin 140.

Further, when the resin thickness t on the insulating substrate 102 is not smaller than 3 mm, it is possible to ensure the required thickness in view of the thickness of the semiconductor chip 110, the height of the connecting wire 116, and the like. Therefore, it is possible to prevent degradation of the reliability due to some causes other than the crack. Further, in accordance with the arrangement space or the like of the semiconductor device 100C, it is possible to achieve thinning of the semiconductor device 100C within a range of 3 mm≤t≤5.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a plurality of circuit units; and
   an external case for accommodating said plurality of circuit units,
   wherein each of said plurality of circuit units comprises:
   an insulating substrate having one main surface on which at least one semiconductor chip and at least one electrode are mounted;
   a base plate having one main surface joined to the other main surface of said insulating substrate; and
   a transfer mold resin which is so provided as to cover said one main surface of said base plate, said insulating substrate, said at least one semiconductor chip, and a junction end of said at least one electrode and expose the other main surface of said base plate,
   wherein the coefficient of linear expansion of said base plate is lower than that of copper and the coefficient of linear expansion of said transfer mold resin is not higher than 16 ppm/° C.,
   said transfer mold resin has such scooped shapes as to expose opposed short-side centers and the vicinity of said base plate, respectively,
   said base plate has mounting holes each penetrating said base plate in a thickness direction in portions exposed by said scooped shapes of said transfer mold resin,
   said each of said plurality of circuit units is thereby provided with said base plate and said transfer mold resin,
   said external case does not cover said exposed main surfaces of said base plates of said plurality of circuit units, and said external case has such a shape as not to block contact of said exposed main surfaces of said base plates of said plurality of circuit units with a mounting surface,
   said plurality of circuit units are aligned so that said exposed main surfaces of said base plates are in a same plane, and
   said external case has holes positioned concentrically to the mounting holes for each base plate, further wherein said one main surface of said base plate has:
   a junction region which corresponds to a range to be joined to said insulating substrate; and
   a surrounding region positioned on a side of said other main surface of said base plate as compared with said junction region in said thickness direction, said transfer mold resin is filled between said surrounding region of said base plate and said insulating substrate.

2. The semiconductor device according to claim 1, wherein a thickness of a portion of said transfer mold resin which is positioned on said one main surface of said insulating substrate is not larger than 5 mm.

3. The semiconductor device according to claim 1, wherein a thickness of a portion of said transfer mold resin which is positioned on said one main surface of said insulating substrate is not smaller than 3 mm.

4. The semiconductor device according to claim 1, wherein said at least one semiconductor chip includes a semiconductor chip using a wide-gap semiconductor as a substrate.

5. The semiconductor device according to claim 1, wherein said at least one electrode includes an electrode protruding from an upper surface of said transfer mold resin which is positioned above said one main surface of said insulating substrate.

6. The semiconductor device according to claim 1, wherein said plurality of circuit units are configured to perform an output operation in different phases.

7. The semiconductor device according to claim 1, wherein said plurality of circuit units are configured to perform an output operation in the same phase.

8. A semiconductor device comprising:
an insulating substrate having one main surface on which at least one semiconductor chip and at least one electrode are mounted;
a base plate having one main surface joined to the other main surface of said insulating substrate; and
a transfer mold resin which is so provided as to cover said one main surface of said base plate, said insulating substrate, said at least one semiconductor chip, and a junction end of said at least one electrode and expose the other main surface of said base plate,
wherein the coefficient of linear expansion of said base plate is lower than that of copper and the coefficient of linear expansion of said transfer mold resin is not higher than 16 ppm/° C.,
said transfer mold resin has such scooped shapes as to expose opposed short-side centers and the vicinity of said base plate, respectively, and
said base plate has mounting holes each penetrating said base plate in a thickness direction in portions exposed by said scooped shapes of said transfer mold resin,
said one main surface of said base plate has:
a junction region which corresponds to a range to be joined to said insulating substrate; and
a surrounding region positioned on a side of said other main surface of said base plate as compared with said junction region in said thickness direction,
said transfer mold resin is filled between said surrounding region of said base plate and said insulating substrate.

9. The semiconductor device according to claim 8, wherein a thickness of a portion of said transfer mold resin which is positioned on said one main surface of said insulating substrate is not larger than 5 mm.

10. The semiconductor device according to claim 8, wherein a thickness of a portion of said transfer mold resin which is positioned on said one main surface of said insulating substrate is not smaller than 3 mm.

11. The semiconductor device according to claim 8, wherein said at least one semiconductor chip includes a semiconductor chip using a wide-gap semiconductor as a substrate.

12. The semiconductor device according to claim 8, wherein said at least one electrode includes an electrode protruding from an upper surface of said transfer mold resin which is positioned above said one main surface of said insulating substrate.

* * * * *